(12) United States Patent
Wang et al.

(10) Patent No.: US 9,607,980 B1
(45) Date of Patent: Mar. 28, 2017

(54) HIGH VOLTAGE TRANSISTOR

(71) Applicant: UNITED MICROELECTRONICS CORP., Hsin-Chu (TW)

(72) Inventors: Jhih-Ming Wang, Yunlin County (TW); Li-Cih Wang, Taoyuan (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/011,681

(22) Filed: Feb. 1, 2016

(30) Foreign Application Priority Data

Jan. 12, 2016 (CN) .......................... 2016 1 0017653

(51) Int. Cl.
| | |
|---|---|
| *H01L 29/66* | (2006.01) |
| *H01L 27/02* | (2006.01) |
| *H01L 29/78* | (2006.01) |
| *H01L 29/08* | (2006.01) |
| *H01L 29/10* | (2006.01) |
| *H01L 29/06* | (2006.01) |

(52) U.S. Cl.
CPC ...... *H01L 27/0266* (2013.01); *H01L 29/0623* (2013.01); *H01L 29/0696* (2013.01); *H01L 29/086* (2013.01); *H01L 29/0878* (2013.01); *H01L 29/1095* (2013.01); *H01L 29/66681* (2013.01); *H01L 29/7816* (2013.01); *H01L 29/7826* (2013.01)

(58) Field of Classification Search
CPC ............. H01L 29/1095; H01L 29/7816; H01L 29/66681

USPC ......................................... 257/335, 337, 339
See application file for complete search history.

(56) References Cited

U.S. PATENT DOCUMENTS

| | | | |
|---|---|---|---|
| 6,198,131 B1 | 3/2001 | Tung | |
| 7,375,408 B2 | 5/2008 | Lee | |
| 7,728,388 B1 | 6/2010 | Tsai | |
| 2013/0056825 A1* | 3/2013 | Chen | ................. H01L 21/26586 257/344 |
| 2013/0256794 A1* | 10/2013 | Lee | ..................... H01L 29/7816 257/339 |
| 2015/0380402 A1* | 12/2015 | Park | ..................... H01L 29/7835 257/337 |

* cited by examiner

*Primary Examiner* — David Vu
*Assistant Examiner* — Brandon Fox
(74) *Attorney, Agent, or Firm* — Winston Hsu; Scott Margo

(57) ABSTRACT

The present invention provides a high voltage transistor including a substrate, a first base region having a first conductivity type, and a first doped region, a second doped region, a second base region and a third doped region having a second conductivity type complementary to the first conductivity type. The first base region, the second doped region, the second base region and the third doped region are disposed in the substrate, and the first doped region is disposed in the substrate. The third doped region, the second base region and the second doped region are stacked sequentially, and the doping concentrations of the third doped region, the second base region and the second doped region gradually increase.

19 Claims, 13 Drawing Sheets

HIGH VOLTAGE TRANSISTOR

BACKGROUND OF THE INVENTION

1. Field of the Invention

The present invention relates to a high voltage transistor, and more particularly, to a high voltage transistor used for an electrostatic discharge protection device of an electrostatic discharge clamp circuit.

2. Description of the Prior Art

Since the irreparable damage of the integrated circuit can be caused by the electrostatic discharge (ESD), the ESD protection circuit has become a necessity to be designed into the integrated circuit, for preventing the unpredictable damage caused by the ESD during the fabrication or the usage of the integrated circuit.

The design of additionally disposing the ESD clamp circuit between power lines has been developed for effectively enhancing the ESD protection of the integrated circuit, and further effectively preventing the damage of the internal circuit by the static electricity. The conventional ESD clamp circuit is formed of LDNMOS transistors, and therefore the conventional ESD clamp circuit has an apparent snap back characteristic and a low holding voltage which is less than the supply voltage provided by the power line. Accordingly, the ESD clamp circuit will be easily mistriggered and turned on, and the latchup will be further induced. Due to the holding voltage is less than the supply voltage when the ESD clamp circuit has been turned on, the ESD clamp circuit might be operated in the holding region by the supply voltage and the high current might be further conducted. At the same time, the internal circuit is still operating, so that the internal circuit of the integrated circuit will be overheated and malfunctioned or even burned under the high current. For preventing the occurrence of the latchup, the holding voltage of the ESD clamp circuit between the power lines must be designed to be greater than the supply voltage. The design of the ESD clamp circuit nowadays is to stack multiple low voltage LDNMOS transistors to form the ESD clamp circuit. The holding voltage can be increased by stacking the transistors, so as to make the holding voltage to be greater than the supply voltage. However, the area of the ESD clamp circuit is limited by the stack of the transistors, so that the size of the chip cannot be further shrunk. Especially, the size of the chip is significantly increased with the increase of the number of the stacked transistors when the high voltage (such as 60 volts, 80 volts or 100 volts) is applied to the ESD clamp circuit. Such disadvantage is unacceptable. Moreover, the holding voltage of the LDNMOS transistor decreases as the duration of the ESD pulse becomes longer, and more transistors is then required.

As a result, providing a high voltage transistor which can be used for an ESD protection device, for enhancing the holding voltage to meet the requirement of the ESD voltage is certainly an objective in this field.

SUMMARY OF THE INVENTION

It is therefore an objective of the present invention to provide a high voltage transistor to increase a holding voltage to meet the requirement of an ESD voltage.

According to a preferred embodiment, a high voltage transistor is disclosed. The high voltage transistor includes a substrate, a high voltage well, a first base region, a first doped region, a second doped region, a second base region and a third doped region. The high voltage well is disposed in the substrate. The first base region is disposed in the high voltage well, wherein the first base region has a first conductivity type. The first doped region is disposed in the first base region, wherein the first doped region has a second conductivity type complementary to the first conductivity type. The second doped region is disposed in the high voltage well at one side of the first base region, wherein the second doped region has the second conductivity type, and the second doped region has a first doping concentration. The second base region is disposed in the high voltage well under the second doped region, and the second base region is contacted with the second doped region, wherein the second base region is contacted with the high voltage well, the second base region has the second conductivity type, the second base region has a second doping concentration, and the second doping concentration is less than the first doping concentration. The third doped region is disposed in the high voltage well under the second base region, and the third doped region is contacted with the second base region, wherein the third doped region has the second conductivity type, the third doped region has a third doping concentration, and the third doping concentration is less than the second doping concentration.

In the high voltage transistor provided by the present invention, the second base region is disposed between the second doped region and the third doped region, and the second base region is contacted with the high voltage well. Therefore, the holding voltage and the ability to endure the ESD voltage can be effectively enhanced, the trigger voltage can be effectively reduced, and the size of the device can be shrunk.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
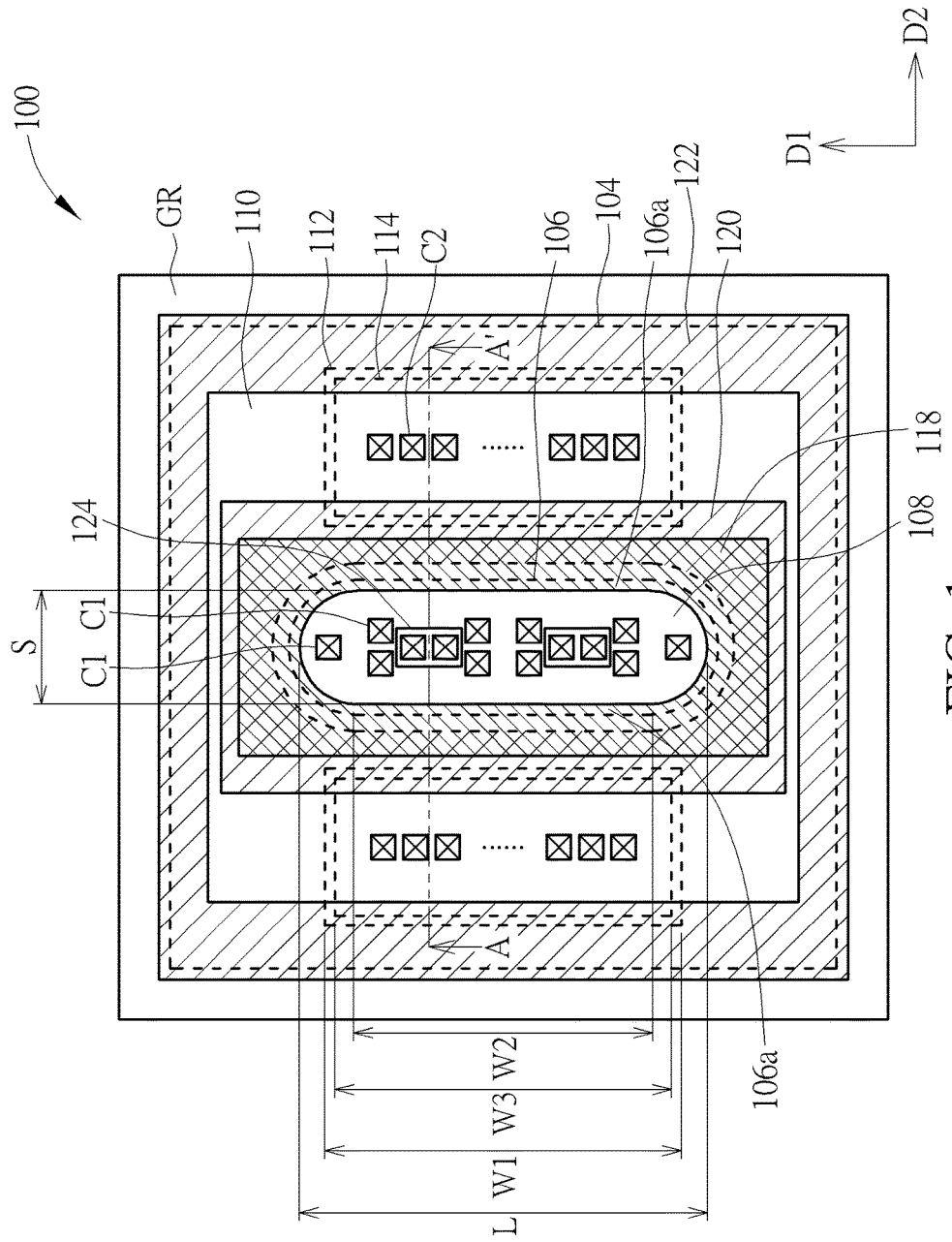
FIG. 1 is a schematic diagram illustrating a top view of a high voltage transistor according to a first embodiment of the present invention.
Figure 2:
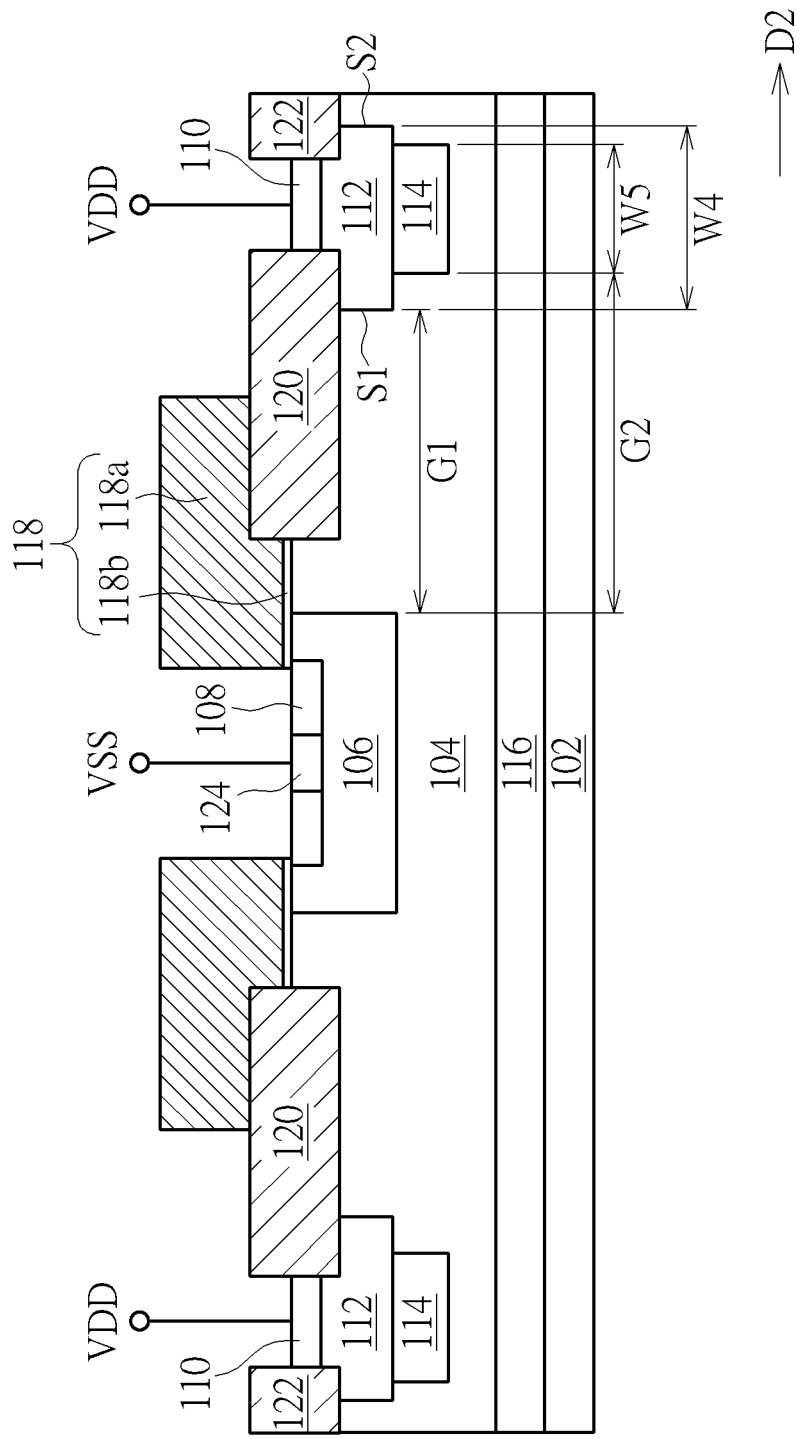
FIG. 2 is a schematic diagram illustrating a cross section of FIG. 1 along a cross-sectional line A-A'.

Please refer to FIG. 1 and FIG. 2. FIG. 1 is a schematic diagram illustrating a top view of a high voltage transistor according to a first embodiment of the present invention, and FIG. 2 is a schematic diagram illustrating a cross section of FIG. 1 along a cross-sectional line A-A'. As shown in FIG. 1 and FIG. 2, a high voltage transistor 100 provided by the present embodiment includes a substrate 102, a high voltage well 104, a first base region 106, a first doped region 108 and a second doped region 110. The high voltage well 104 is disposed in the substrate 102, the first base region 106 is disposed in the high voltage well 104, the first doped region 108 is disposed in the first base region 106, and the second doped region 110 is disposed in the high voltage well 104 at one side of the first base region 106. Specifically, the first base region 106 has a first conductivity type. The high voltage well 104, the first doped region 108 and the second doped region 110 has a second conductivity type complementary to the first conductivity type. Therefore, the first doped region 108 may be used as a source region/drain region of the high voltage transistor 100, for being electrically connected to a low-voltage end VSS (such as a low-voltage power line or a ground line). The second doped region 110 may be used as a drain region/source region of the high voltage transistor 100, for being electrically connected to a high-voltage end VDD (such as a high-voltage power line). For example, the first conductivity type and the second conductivity type are preferably and respectively n-type and p-type, and therefore the high voltage transistor 100 is a p-type transistor preferably, but not limited thereto. Those skilled in the art should be known that the first conductivity type of the present embodiment may also be p-type and the second conductivity type of the present embodiment may be n-type. In addition, the substrate 102 may be a silicon substrate, a silicon-included substrate, a silicon-on-insulator (SOI) substrate or other semiconductor substrates for example.

Specifically, the first base region 106 of the present embodiment may have a racetrack-shaped layout. Therefore, the first base region 106 includes a long axis L parallel to a first direction D1 and a short axis S parallel to a second direction D2, and the first base region 106 may include two straight portions 106a opposite to each other and parallel to the long axis L respectively. The second doped region 110 surrounds the first base region 106, and each of the straight portions 106a may be used as an effective channel region of the high voltage transistor 100.

In addition, the high voltage transistor 100 may further include a second base region 112 and a third doped region 114. The second base region 112 is disposed in the high voltage well 104 under the second doped region 110, a top surface of the second base region 112 is further contacted with the second doped region 110, and the second base region 112 is contacted with the high voltage well 104. The third doped region 114 is disposed in the high voltage well 104 under the second base region 112, and a top surface of the third doped region 114 is contacted with the second base region 112. The second base region 112 and the third doped region 114 both have the second conductivity type. Specifically, the high voltage transistor 100 of the present embodiment includes two second base regions 112 and two third doped regions 114, the second base regions 112 are respectively disposed corresponding to the straight portions 106a of the first base region 106, and the second base regions 112 are disposed at two sides of the first base region 106 under the second doped region 110. Each of the third doped regions 114 is disposed under the corresponding second base region 112 respectively. Since the conductivity types of the second base regions 112 and the third doped regions 114 are the same as the conductivity type of the second doped region 110, a width W1 of each of the second base regions 112 in the first direction D1 is greater than or equal to a width of a straight side edge of the first base region 106 in the first direction D1 (i.e. a width W2 of the straight portion 106a in the first direction D1), and a width W3 of each of the third doped regions 114 in the first direction D1 is also greater than or equal to the width W2 of the straight portion 106a in the first direction D1, so that the second base regions 112 and the third doped regions 114 can be used as a portion of the drain region/source region of the high voltage transistor 100, and the entire straight portion 106a can be used as the channel region.

In the present embodiment, a distance G1 between a first side edge S1 of each of the second base regions 112 facing the first base region 106 and the straight side edge of the first base region 106 facing the second base region 112 is smaller than a distance G2 between an outer side edge of each of the third doped regions 114 facing the first base region 106 and the straight side edge of the first base region 106 facing the second base region 112, so that the first side edge S1 of each of the second base regions 112 facing the first base region 106 is contacted with the high voltage well 104, and each of the third doped regions 114 is not contacted with the second doped region 110. For example, a distance between the first side edge S1 of each of the second base regions 112 facing the first base region 106 and a second side edge S2 of each of the second base regions 112 opposite to the first side edge S1 (i.e. a width W4 of each of the second base regions 112 in the second direction D2) is greater than a distance between two opposite outer side edges of each of the third doped regions 114 (i.e. a width W5 of each of the third doped regions 114 in the second direction D2), and the width W1 of each of the second base regions 112 in the first direction D1 is also greater than the width W3 of each of the third doped regions 114 in the first direction D1. Accordingly, an area of each of the second base regions 112 is greater than an area of each of the third doped regions 114, so that the second doped region 110 and each of the third doped regions 114 can be separated by each of the second base regions 112.

In addition, the second doped region 110 has a first doping concentration, the second base regions 112 have a second doping concentration, and the third doped regions 114 have a third doping concentration, wherein the second doping concentration is less than the first doping concentration, and the third doping concentration is less than the second doping concentration. For example, the first doping concentration is substantially $10^{19}$ cm$^{-3}$ to $10^{20}$ cm$^{-3}$, the second doping concentration is substantially $4\times10^{17}$ cm$^{-3}$ to $1\times10^{18}$ cm$^{-3}$, and the third doping concentration is substantially $5 \times 10^{16}$ cm$^{-3}$ to $8 \times 10^{16}$ cm$^{-3}$, but the present invention is not limited thereto. In the present embodiment, the high voltage well 104 can also have the second conductivity type, and the high voltage well 104 has a fourth doping concentration less than the third doping concentration. For example, the fourth doping concentration may substantially be $4 \times 10^{15}$ cm$^{-3}$ to $1 \times 10^{16}$ cm$^{-3}$.

It is noteworthy that the doping concentrations of the second doped region 110, the second base regions 112, the third doped regions 114 and the high voltage well 104 gradually decrease, and the width W4 of each of the second base regions 112 is greater than the width W5 of each of the third doped regions 114. The resistance between each of the third doped regions 114 with the doping concentration closer to the high voltage well 104 than that of each of the second base regions 112 and the high voltage well 104 is less than the resistance between each of the second base regions 112 and the high voltage well 104, so that the electrostatic current generated from the high-voltage end VDD may flow from the second doped region 110 electrically connected to the high-voltage end VDD and disposed on the top through each of the second base regions 112 and each of the third doped regions 114 in sequence, and the electrostatic current may further be guided to the high voltage well 104 even if each of the second base regions 112 is contacted with the high voltage well 104. The endurable ESD voltage and the holding voltage cannot be effectively enhanced due to the electrostatic discharge (ESD) path is near to the surface of the substrate in the high voltage transistor without disposing the second base regions. On the contrary, the high voltage transistor 100 of the present embodiment includes the second base regions 112, and the static electricity is required to be guided to a part of the high voltage well 104 that is deeper and much distant from the surface of the substrate 102. Therefore, the high voltage transistor 100 has a longer ESD path, and the holding voltage of the high voltage transistor 100 can be effectively enhanced. In addition, the static electricity of the high voltage transistor 100 of the present embodiment can be guided to the high voltage well 104 that is disposed deeper in the high voltage transistor 100, so that the heat generated by the static electricity can be effectively dispersed in the deeper high voltage well 104, the heat will not accumulate in the high voltage well 104 near the surface region of the substrate 102, and the endurable ESD voltage can further be enhanced. Accordingly, in the high voltage transistor 100 of the present embodiment, the endurable ESD voltage of the human body mode (HBM) may be greater than 2 kilovolts (kV), and the endurable ESD voltage of the machine mode (MM) may be greater than 200 volts (V). Comparing to the conventional stacked structure, only one high voltage transistor 100 of the present embodiment is needed to meet the requirements, and therefore the area of the device can be effectively shrunk. For example, when the channel width of the high voltage transistor 100 of the present embodiment is designed to be 1500 micrometers and the voltage provided by the high-voltage end VDD is 40, 80 and 100 V respectively, the area of the high voltage transistor 100 may then be 161×139, 228×149 and 157×272 micrometer square respectively, the endurable ESD voltage of the HBM may be approximately 2, 2.8 and 3 kV respectively, and the endurable ESD voltage of the MM may be approximately 200, 300 and 250 V respectively. As compared with the high voltage transistor 100 of the present embodiment, the high voltage transistor without disposing the second base region cannot endure the ESD voltages of the MM and the HBM under the same condition of the voltage of the high-voltage end even if the area of the high voltage transistor that does not include the second base region is increased to be greater than twice of the area of the transistor of the present embodiment. Therefore, the device area can effectively be shrunk via the high voltage transistor 100 of the present embodiment.

In addition, the first side edge S1 of each of the second base regions 112 facing the first base region 106 of the present embodiment may be contacted with the high voltage well 104, the range of the endurable voltage of the high voltage transistor 100 may be determined by the distance G1 between each of the second base regions 112 and the first base region 106, so that the trigger voltage of the high voltage transistor 100 triggered by the ESD may be determined by the distance G1. Thus, the trigger voltage of the high voltage transistor 100 may then be effectively reduced, for preventing the ESD from being flowed to the internal circuit and damaging the internal circuit. For example, if the voltage provided by the high-voltage end VDD is 80 V, and when the distance G1 between each of the second base regions 112 and the first base region 106 of the high voltage transistor 100 is 6.1 and 6.7 micrometers respectively, the trigger voltage of the high voltage transistor 100 may then be 97.49 and 108.74 V respectively. For another example, if the voltage provided by the high-voltage end VDD is 100 V, and when the distance G1 between each of the second base regions 112 and the first base region 106 of the high voltage transistor 100 is 8.1 and 8.7 micrometers respectively, the trigger voltage of the high voltage transistor 100 may then be 120.23 and 123.11 V respectively. Comparing to the high voltage transistor 100 of the present embodiment, the trigger voltage of the high voltage transistor without disposing the second base region may be 111.15 and 128.95 V respectively under the condition of the voltage provided by the high-voltage end is 80 and 100 V respectively. From the above, not only the holding voltage and the endurable ESD voltage of the present embodiment can be effectively enhanced, the trigger voltage can also be reduced effectively by disposing the second base region 112 in the high voltage transistor 100. Therefore, the internal circuit can be effectively protected and prevented from being damaged by the ESD when the high voltage transistor 100 is used as the ESD protection device of the ESD clamp circuit.

In the present embodiment, a buried layer 116 may selectively be included in the high voltage transistor 100, and the buried layer 116 is disposed in the substrate 102 and has the second conductivity type. The high voltage well 104 is disposed on the buried layer 116, and thus the buried layer 116 may be used for preventing the signal of the high voltage transistor 100 from being transmitted downward to the substrate 102 and causing the current leakage. The substrate 102 and the high voltage well 104 can be isolated by the buried layer 116, and the substrate 102 of the present embodiment may have the first conductivity type or the second conductivity type. In another embodiment, the buried layer may also not be included in the high voltage transistor.

Also, a gate structure 118, a first isolation structure 120 and a second isolation structure 122 may selectively be included in the high voltage transistor 100. The gate structure 118 is disposed on the first base region 106 and the high voltage well 104 between each of the second base regions 112 and the first doped region 108. A gate electrode 118a and a gate insulating layer 118b may be included in the gate structure 118, and the gate insulating layer 118b is disposed between the gate electrode 118a and the substrate 102. The first isolation structure 120 is disposed between the gate structure 118 and the high voltage well 104 for isolating the gate structure 118 and the second doped region 110 and preventing the gate insulating layer 118b from being damaged by the high electric field in the second doped region 110. Specifically, the gate structure 118 is disposed along the side edge of the first base region 106 and overlaps a portion of the first base region 106 adjoining to the side edge, and further surrounds a portion of the first base region 106. In addition, the gate structure 118 has an opening for defining the position of the first doped region 108. The gate electrode 118a is preferably extended to cover a portion of the first isolation structure 120. Also, the first isolation structure 120 surrounds the first base region 106, but does not contact with the first base region 106. The second isolation structure 122 is disposed on the substrate 102 and surrounds the second doped region 110. For example, the first isolation structure 120 and the second isolation structure 122 may be shallow trench isolations (namely STI) or field oxide layers respectively, but not limited thereto.

What's more, the high voltage transistor 100 of the present embodiment may further include a doped contact region 124, a first contact plug C1, a second contact plug C2 and a guard ring GR. The doped contact region 124 is disposed in the first doped region 108 and contacted with the first base region 106, and the first contact plug C1 is disposed on the doped contact region 124 and the first doped region 108. The doped contact region 124 has the second conductivity type for reducing the contact resistance between the first doped region 108 and the first contact plug C1. The first contact plug C1 is used for electrically connecting the first doped region 108 of the high voltage transistor 100 to the low-voltage end VSS. The second contact plug C2 is disposed on the second doped region 110 located right on the top of the third doped region 114, for electrically connecting the second doped region 110 of the high voltage transistor 100 to the high-voltage end VDD. The guard ring GR surrounds the second isolation structure 122 and the high voltage well 104 for isolating the high voltage transistor 100 with other devices. Also, the guard ring GR of the present embodiment is not contacted with the high voltage well 104, but not limited thereto.

It is noteworthy that in the high voltage transistor 100 of the present embodiment, the second base region 112 is disposed between the second doped region 110 and the third doped region 114, and the first side edge S1 of the second base region 112 facing the first base region 106 is contacted with the high voltage well 104. Therefore, the holding voltage and the ability to endure the ESD voltage can be effectively enhanced, and the trigger voltage can be effectively reduced. In addition, the fabrication of the high voltage transistor 100 of the present embodiment does not require excess area and extra photomask while adopting the fabrication of the conventional complementary metal oxide semiconductor (CMOS) transistor, and therefore the increase of the fabrication cost may further be prevented.

Figure 3:
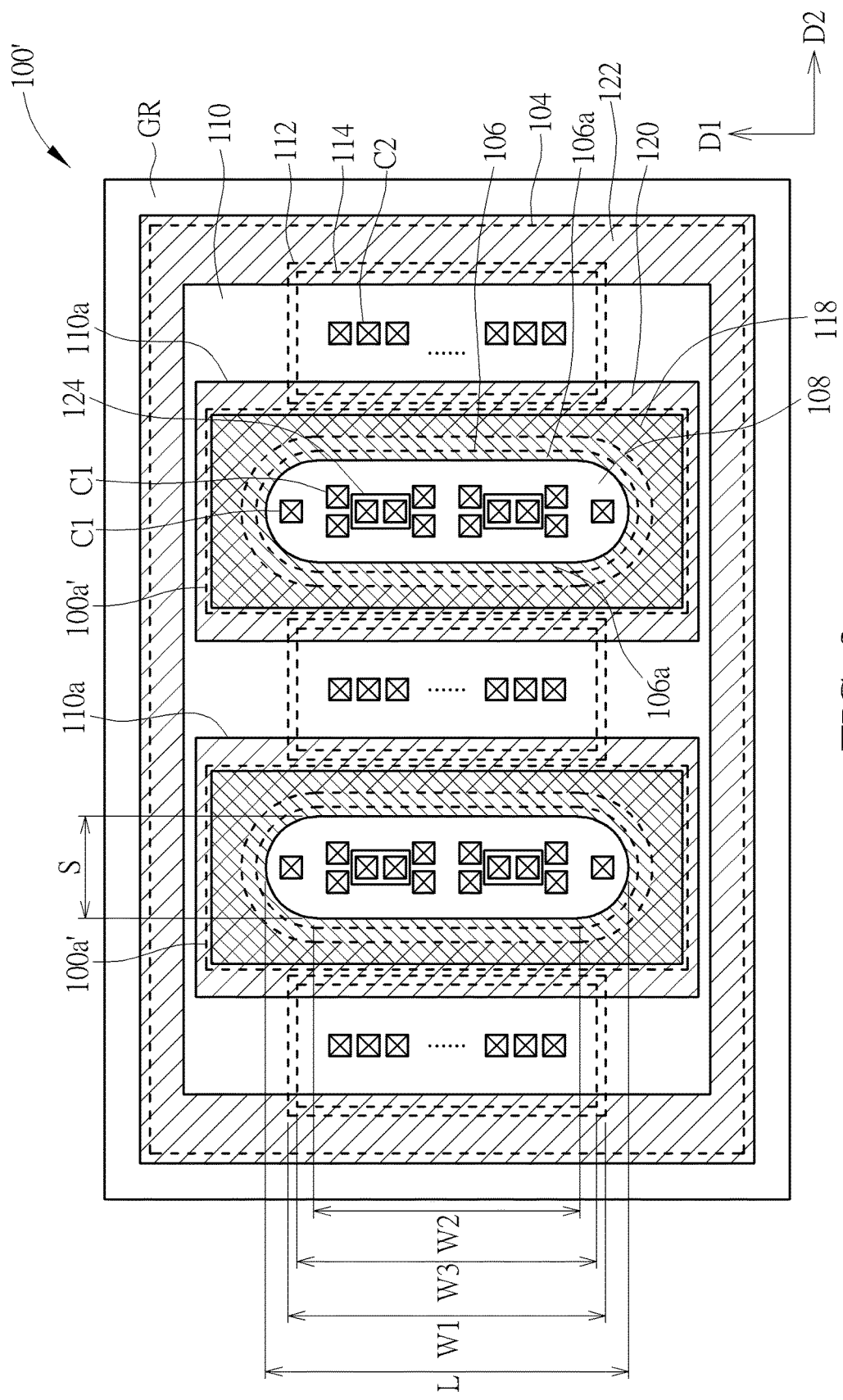
FIG. 3 is a schematic diagram illustrating a cross section of a high voltage transistor according to a variant embodiment of the first embodiment of the present invention.

In another variant embodiment, as shown in FIG. 3, the high voltage transistor 100' may include a plurality of unit structures 100a', a plurality of second base regions 112 and a plurality of third doped regions 114. The unit structures 100a' are arranged along the second direction D2, and each of the unit structures 100a' may include the first base region 106, the first doped region 108, the gate structure 118, the first isolation structure 120 and the doped contact region 124 shown in FIG. 1 of the first embodiment. In addition, the second doped region 110 of the high voltage transistor 100' may have a plurality of openings 110a arranged along the second direction D2, and the first base region 106, the first doped region 108, the gate structure 118, the first isolation structure 120 and the doped contact region 124 of each of the unit structures 100a' are disposed in each of the openings 110a. Each of the third doped regions 114 is disposed corresponding to each of the second base regions 112, and each of the second base regions 112 and each of the first base regions 106 are arranged alternately in the second direction D2.

The high voltage transistor of the present invention is not limited to the above mentioned embodiment. The following description will detail the high voltage transistor of other preferable embodiments. To simplify the description, identical components in each of the following embodiments are marked with identical symbols. For making it easier to understand the differences between the embodiments, the following description will detail the dissimilarities among different embodiments and the identical portions will not be redundantly described.

Figure 4:
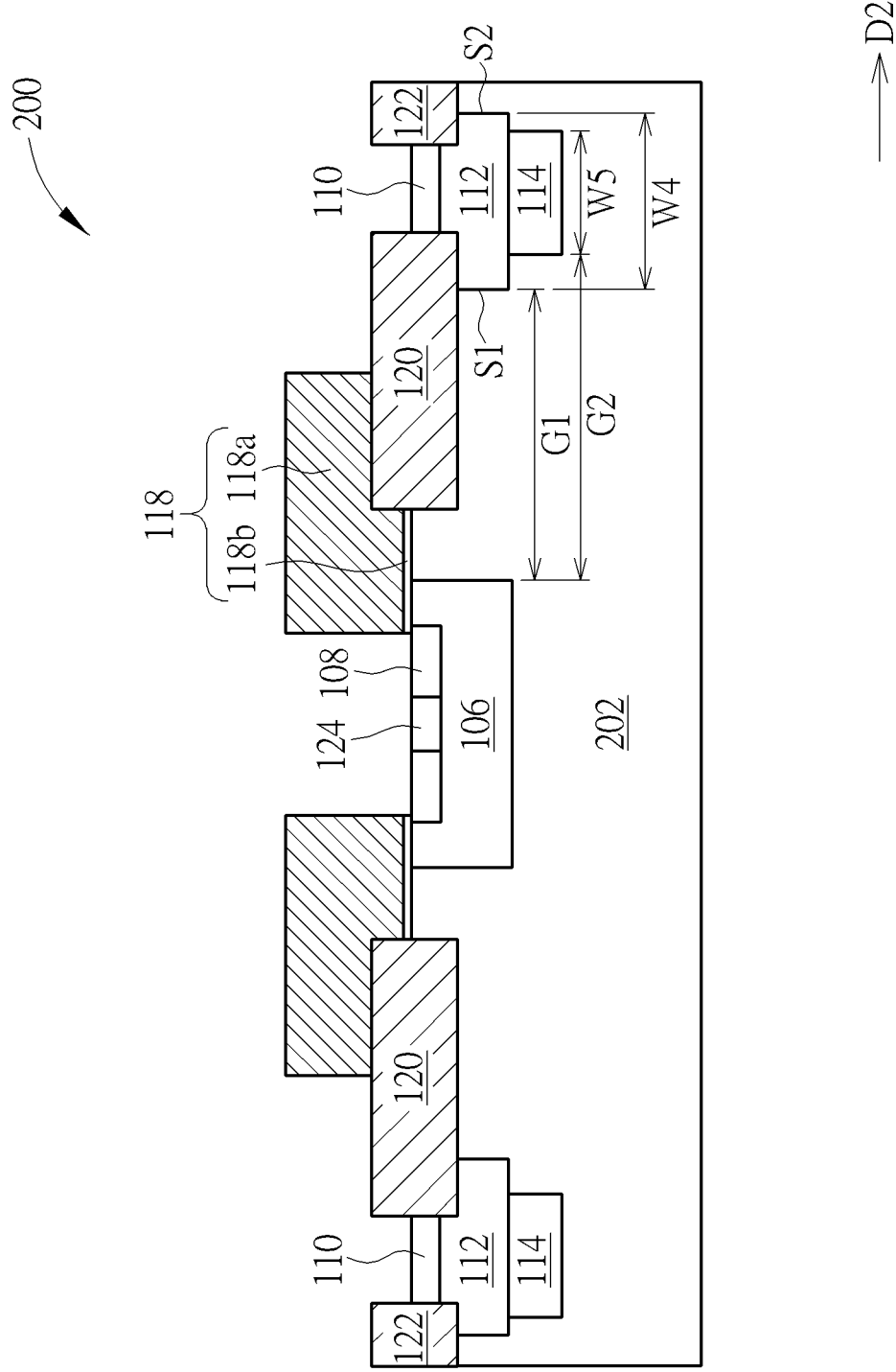
FIG. 4 is a schematic diagram illustrating a cross section of a high voltage transistor according to a second embodiment of the present invention.

Please refer to FIG. 4, which is a schematic diagram illustrating a cross section of a high voltage transistor according to a second embodiment of the present invention. As shown in FIG. 4, a high voltage transistor 200 provided by the present embodiment may not include the high voltage well and the buried layer as compared with the first embodiment. Specifically, the substrate 202 of the high voltage transistor 200 of the present embodiment has the second conductivity type and a fifth doping concentration that is the same as the fourth doping concentration of the first embodiment, and the fifth doping concentration is less than the third doping concentration accordingly. In addition, the first base region 106, the second doped region 110, the second base regions 112 and the third doped regions 114 are all disposed in the substrate 202. The distance G1 between a first side edge 51 of each of the second base regions 112 facing the first base region 106 and the straight side edge of the first base region 106 facing the second base region 112 is less than the distance G2 between the outer side edge of each of the third doped regions 114 facing the first base region 106 and the straight side edge of the first base region 106 facing the second base region 112.

Figure 5:
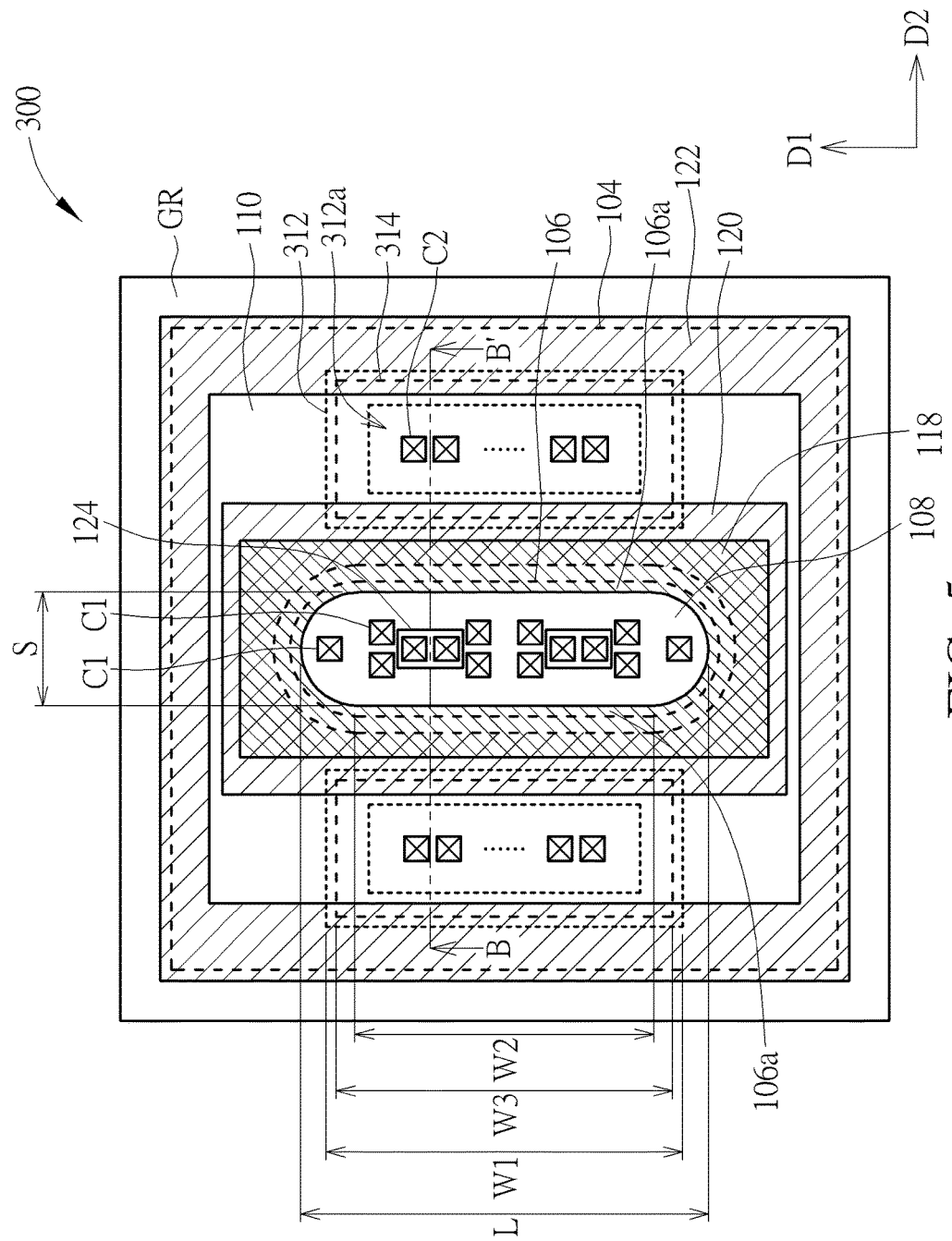
FIG. 5 is a schematic diagram illustrating a top view of a high voltage transistor according to a third embodiment of the present invention.
Figure 6:
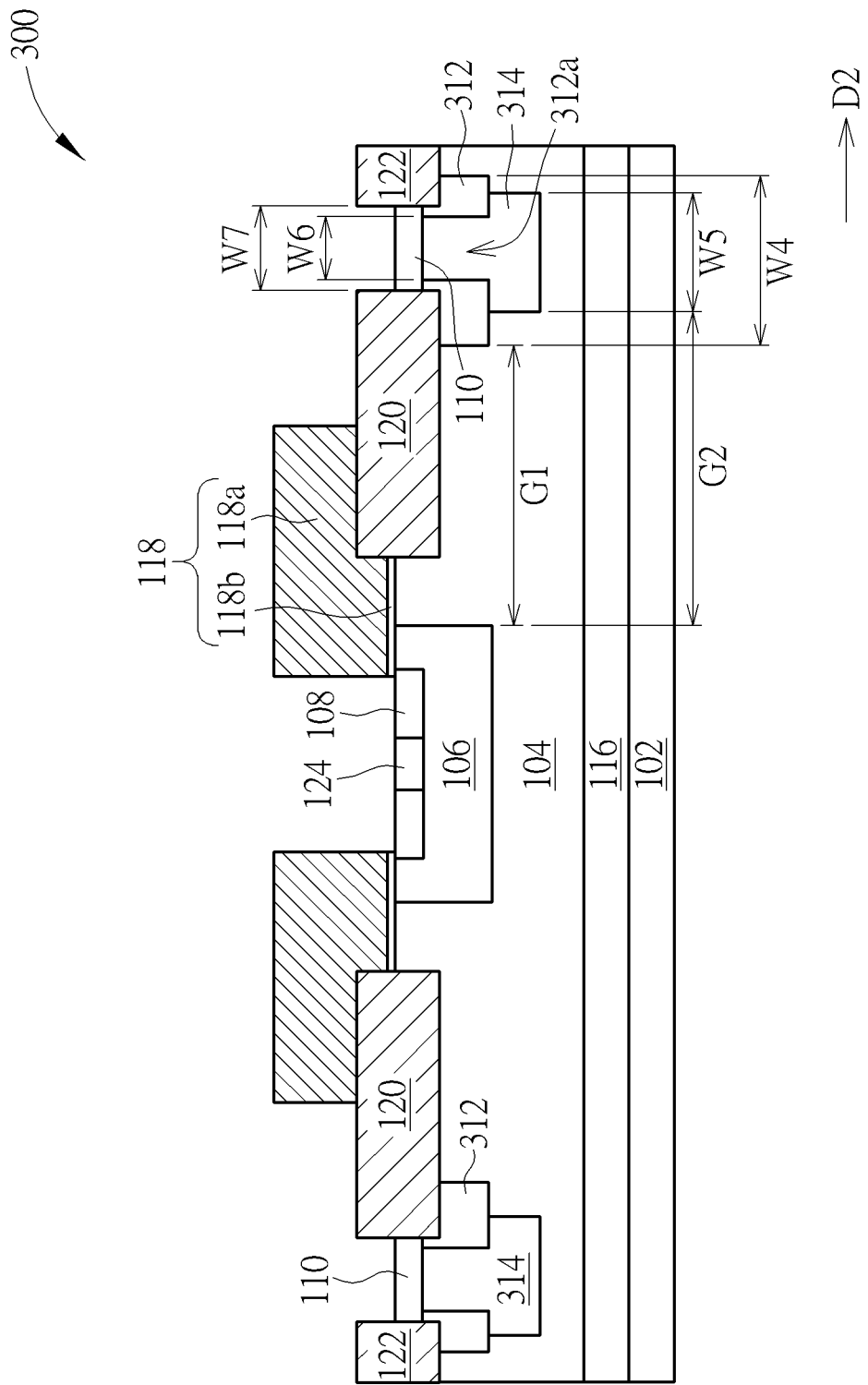
FIG. 6 is a schematic diagram illustrating a cross section of FIG. 5 along a cross-sectional line B-B'.

Please refer to FIG. 5 and FIG. 6. FIG. 5 is a schematic diagram illustrating a top view of a high voltage transistor according to a third embodiment of the present invention, and FIG. 6 is a schematic diagram illustrating a cross section of FIG. 5 along a cross-sectional line B-B'. As shown in FIG. 5 and FIG. 6, each of the third doped regions 314 may be contacted with the second doped region 110 in a high voltage transistor 300 of the present embodiment comparing to the first embodiment. Specifically, each of the second base regions 312 of the present embodiment has a through hole 312a disposed corresponding to the second doped region 110. Each of the third doped regions 314 may be contacted with the corresponding second doped region 110 via each of the through holes 312a. A width W6 of each of the through holes 312a in the second direction D2 is less than a width W7 of the second doped region 110 in the second direction D2 and a width W5 of each of the third doped regions 314 in the second direction D2.

Figure 7:
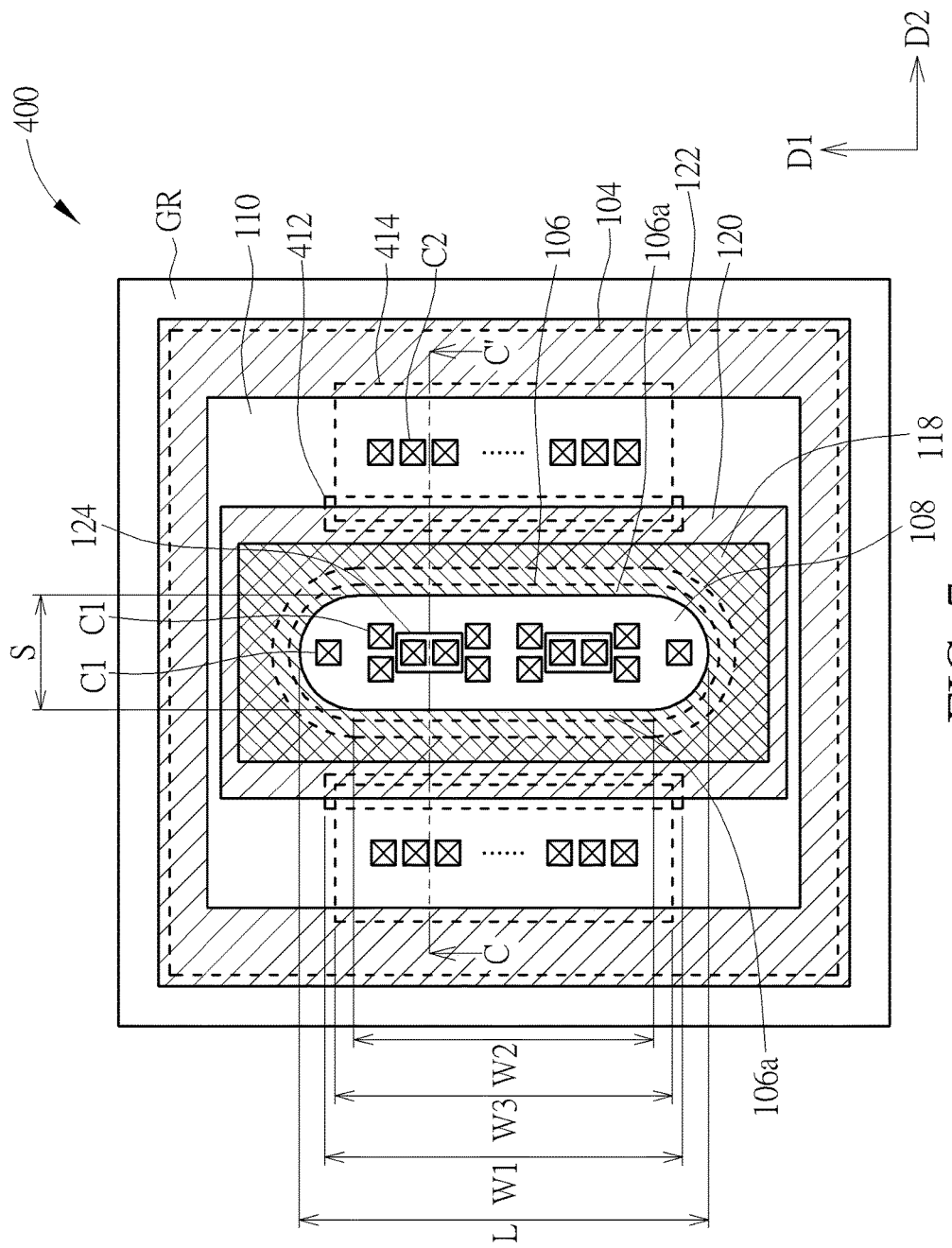
FIG. 7 is a schematic diagram illustrating a top view of a high voltage transistor according to a fourth embodiment of the present invention.
Figure 8:
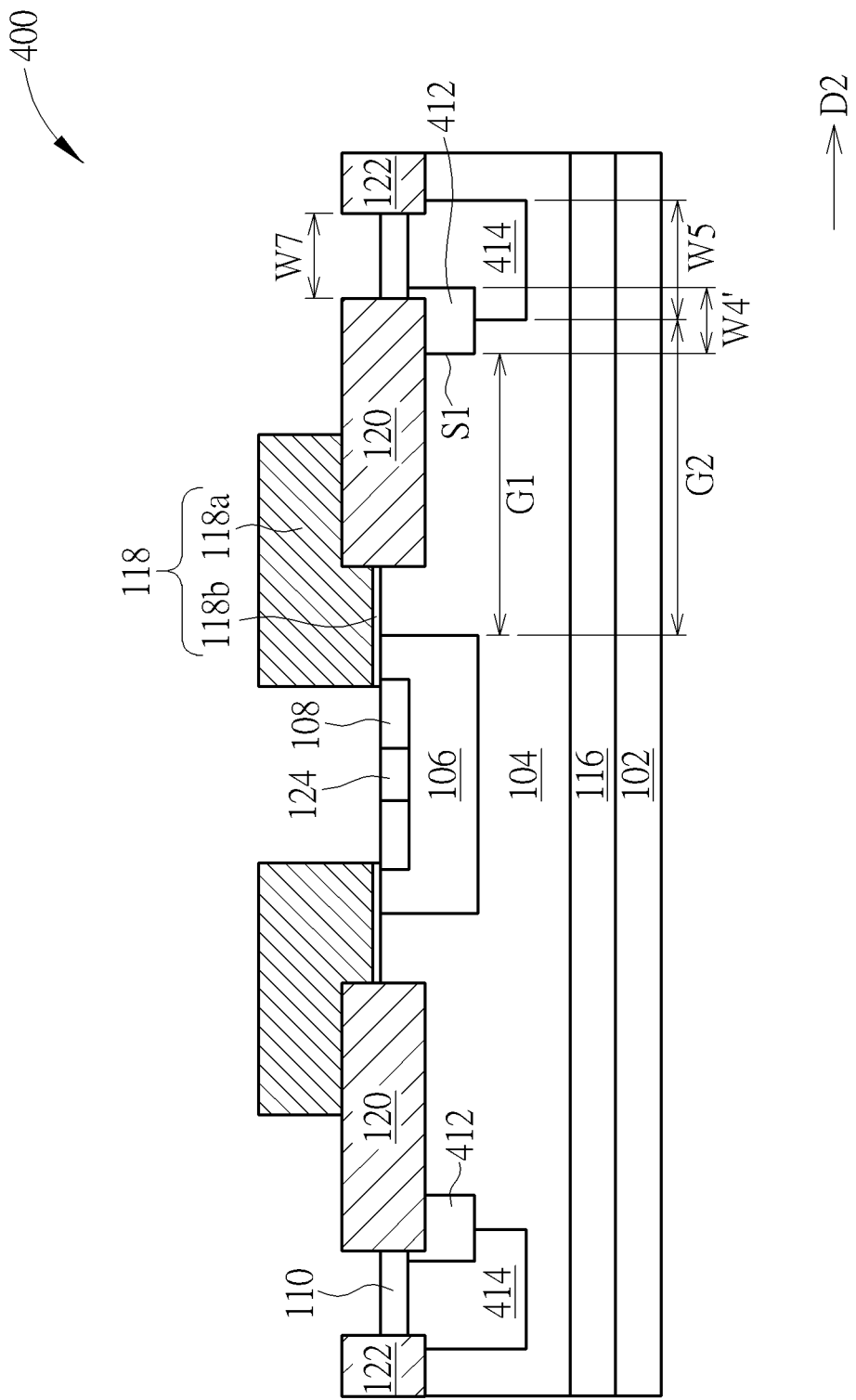
FIG. 8 is a schematic diagram illustrating a cross section of FIG. 7 along a cross-sectional line C-C'.

Please refer to FIG. 7 and FIG. 8. FIG. 7 is a schematic diagram illustrating a top view of a high voltage transistor according to a fourth embodiment of the present invention, and FIG. 8 is a schematic diagram illustrating a cross section of FIG. 7 along a cross-sectional line C-C'. As shown in FIG. 7 and FIG. 8, each of the third doped regions 414 is extended to a side of each of the second base regions 412 opposite to a first side edge S1 and contacted with the second doped region 110 in a high voltage transistor 400 of the present embodiment comparing to the first embodiment. Specifically, each of the second base regions 412 is only disposed between a portion of the second doped region 110 adjoining to the first base region 106 and a portion of each of the third doped regions 414, and the second base region 412 is not extended to an outer side of each of the third doped regions 414 facing the guard ring GR. Therefore, each of the third doped regions 414 may be disposed at the side of each of the second base regions 412 opposite to the first side edge S1, and contacted with the second doped region 110. For example, a width W4' of each of the second base regions 412 in the second direction D2 may be less than the width W7 of the second doped region 110 in the second direction D2 and the width W5 of the third doped region 414 in the second direction D2.

In another variant embodiment, the high voltage transistor may also not include the high voltage well and the buried layer. In another variant embodiment, the high voltage transistor may also include a plurality of unit structures surrounded by the second doped region shown in FIG. 8. In addition, two second base regions are disposed between any two adjoining unit structures of the high voltage transistor, and the second base regions are respectively disposed between each of the first base regions and the third doped region contacted with the second doped region.

Figure 9:
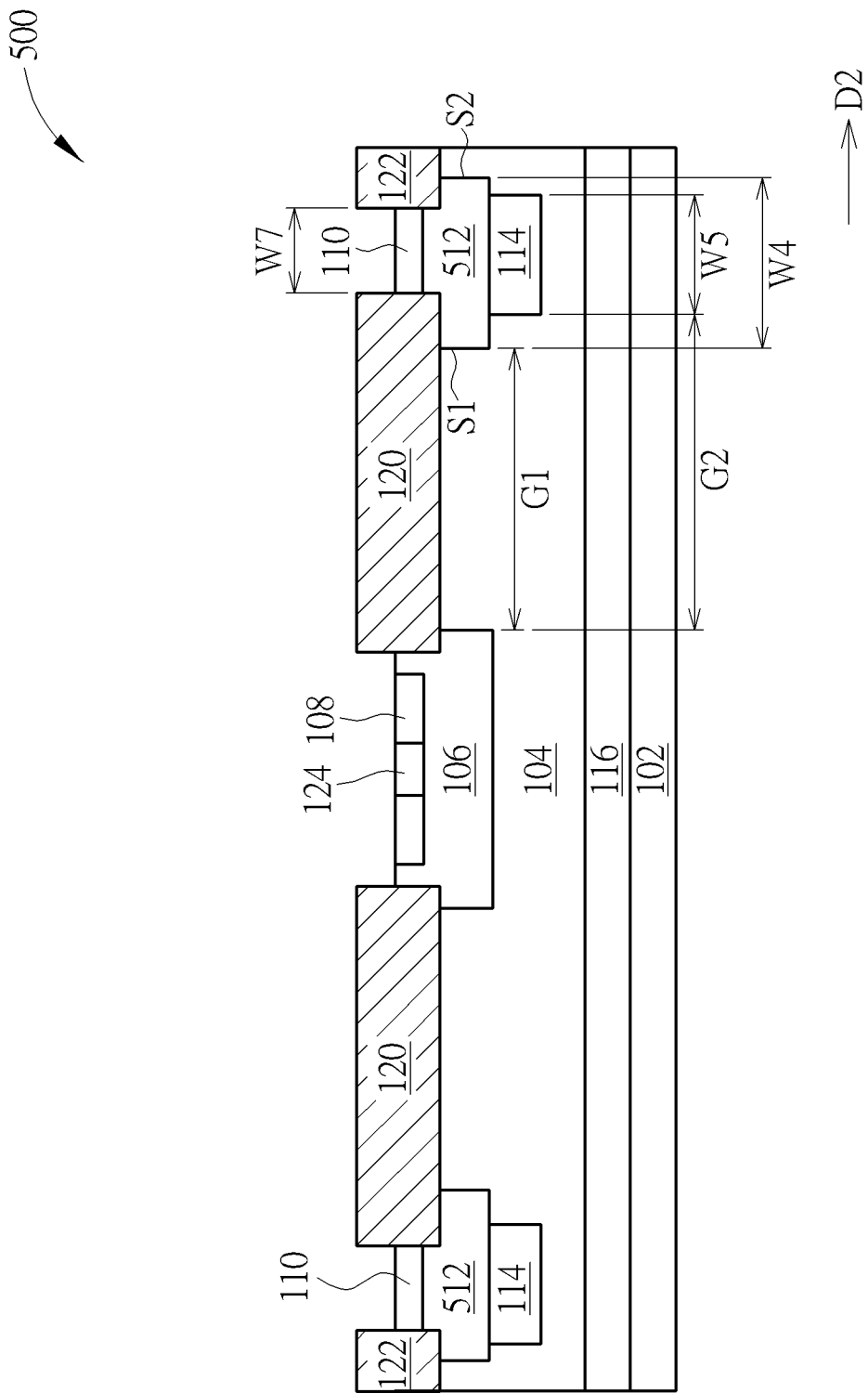
FIG. 9 is a schematic diagram illustrating a cross section of a high voltage transistor according to a fifth embodiment of the present invention.

Please refer to FIG. 9, which is a schematic diagram illustrating a cross section of a high voltage transistor according to a fifth embodiment of the present invention. As shown in FIG. 9, a high voltage transistor 500 provided by the present embodiment does not include the gate structure comparing to the first embodiment. Specifically, a high voltage transistor 500 of the present embodiment may be a bipolar junction transistor (BJT). A width W4 of each of the second base regions 512 in the second direction D2 is greater than a width W7 of the corresponding second doped region 110 in the second direction D2, and therefore each of the second base regions 512 may be extended to two sides of the corresponding second doped region 110. In the present embodiment, an inner side of a first isolation structure 120 may be extended to the first base region 106 and contacted with the first base region 106, or even extended to be contacted with the first doped region 108, but not limited thereto.

In a variant embodiment, the high voltage transistor may not include the first isolation structure and the second isolation structure. In another variant embodiment, the high voltage transistor may not include the high voltage well and the buried layer also. In another embodiment, the through hole of the third embodiment may also be applied to each of the second base regions, or each of the second base regions disposed between a portion of the second doped region adjoining to the first base region and a portion of each of the third doped regions of the fourth embodiment may be adopted, for contacting the third doped regions with the second doped region.

Figure 10:
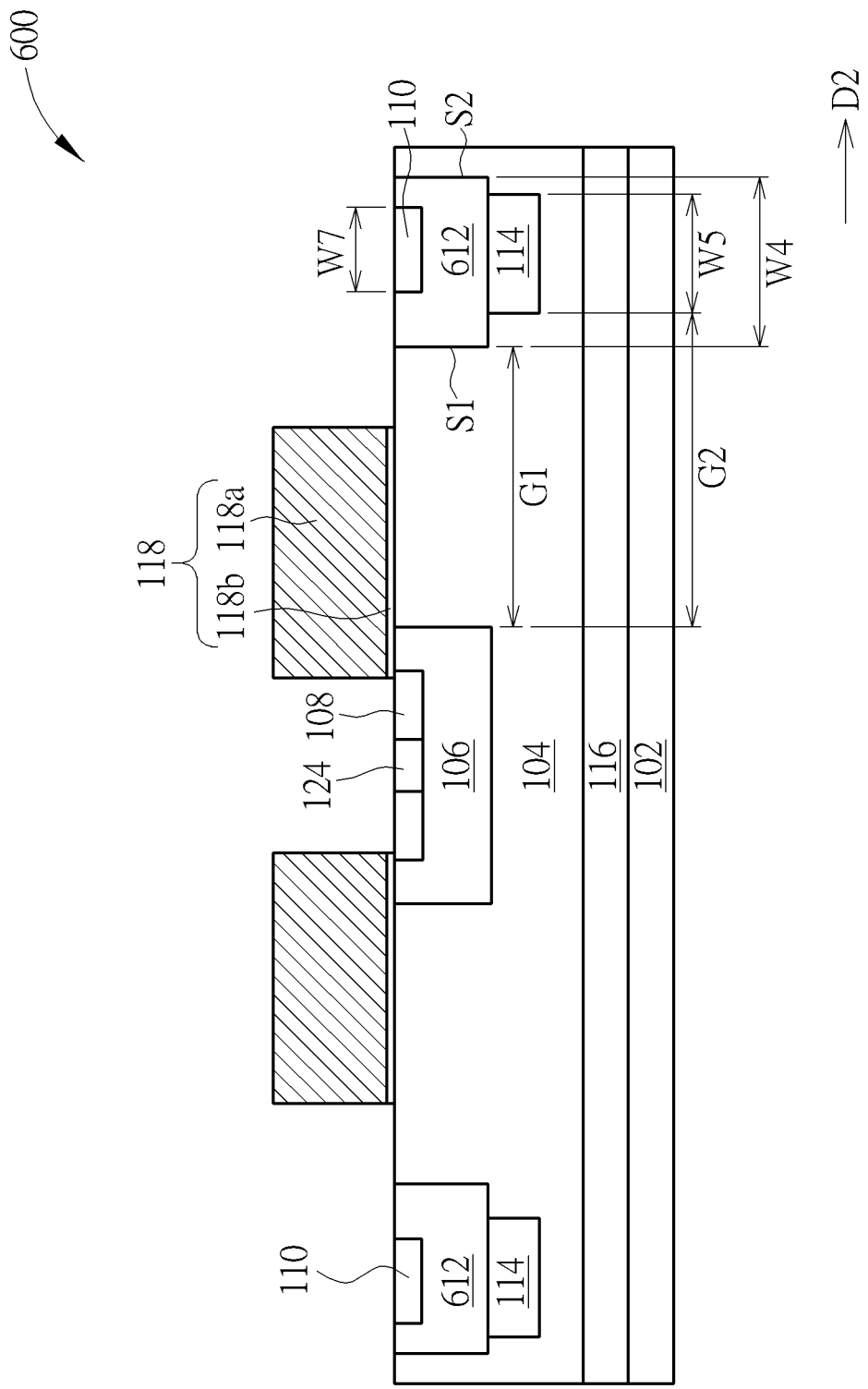
FIG. 10 is a schematic diagram illustrating a cross section of a high voltage transistor according to a sixth embodiment of the present invention.

Please refer to FIG. 10, which is a schematic diagram illustrating a cross section of a high voltage transistor according to a sixth embodiment of the present invention. As shown in FIG. 10, a high voltage transistor 600 provided by the present embodiment does not include the first isolation structure and the second isolation structure comparing to the first embodiment. In addition, the width W4 of each of the second base regions 612 in the second direction D2 is greater than a width W7 of the corresponding second doped region 110 in the second direction D2, and therefore each of the second base regions 612 may be extended to two sides of the corresponding second doped region 110.

In another embodiment, the high voltage transistor may not include the high voltage well and the buried layer also. In another variant embodiment, the through hole of the third embodiment may also be applied to each of the second base regions, or each of the second base regions disposed between a portion of the second doped region adjoining to the first base region and a portion of each of the third doped regions of the fourth embodiment may be adopted, for contacting the third doped regions with the second doped region.

Figure 11:
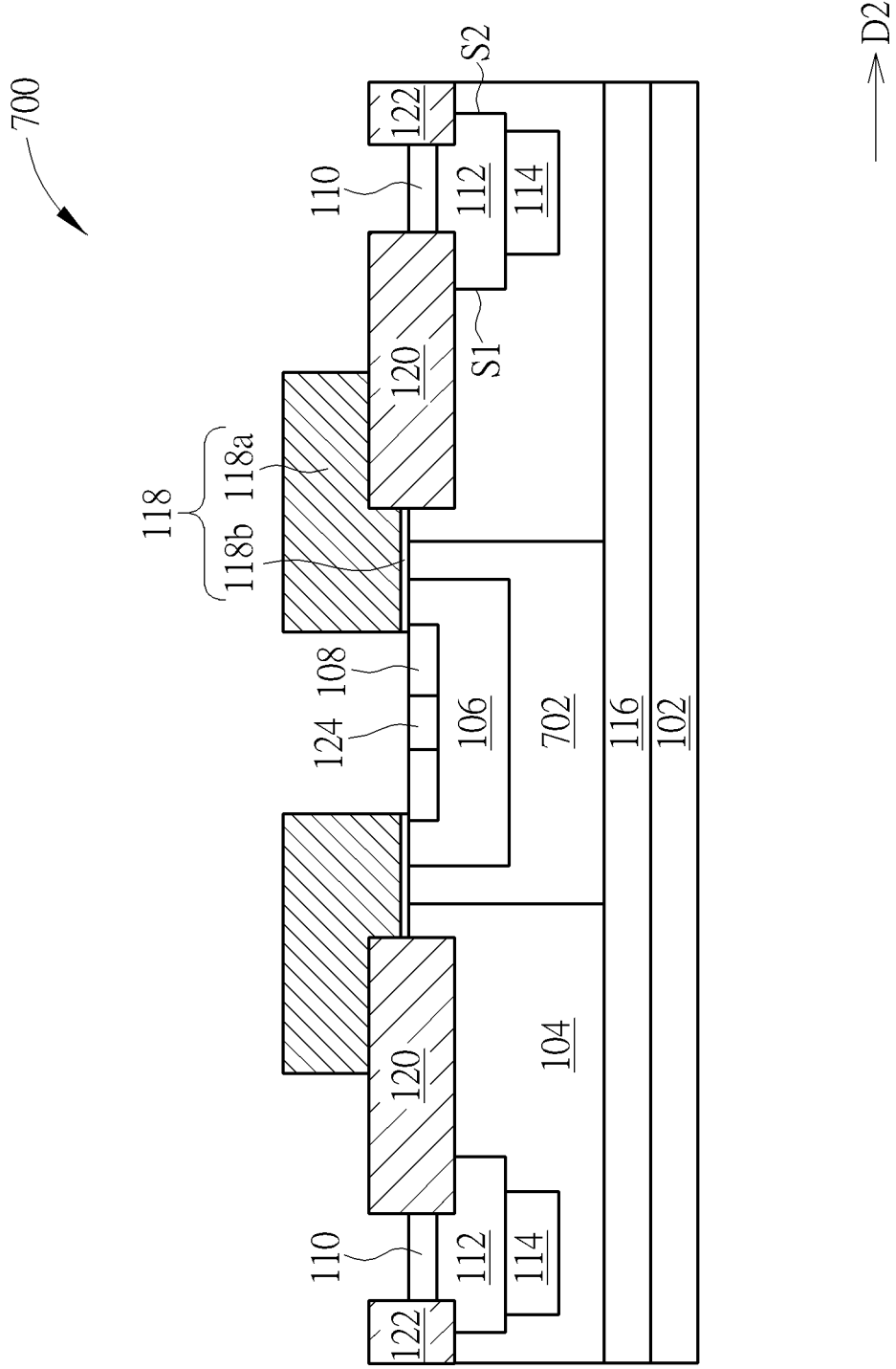
FIG. 11 is a schematic diagram illustrating a cross section of a high voltage transistor according to a seventh embodiment of the present invention.

Please refer to FIG. 11, which is a schematic diagram illustrating a cross section of a high voltage transistor according to a seventh embodiment of the present invention. As shown in FIG. 11, a high voltage transistor 700 provided by the present embodiment further includes a high voltage deep well 702 comparing to the first embodiment. The high voltage deep well 702 is disposed in the high voltage well 104, and the high voltage deep well 702 encompasses the first base region 106, wherein the high voltage deep well 702 has the first conductivity type. In the present embodiment, the range of the endurable voltage of the high voltage transistor 700 may be determined by the distance between the high voltage deep well 702 and the first base region 106.

In another embodiment, the high voltage transistor may not include the high voltage well and the buried layer also. In another variant embodiment, the through hole of the third embodiment may also be applied to each of the second base regions, or each of the second base regions disposed between a portion of the second doped region adjoining to the first base region and a portion of each of the third doped regions of the fourth embodiment may be adopted, for contacting the third doped regions with the second doped region.

Figure 12:
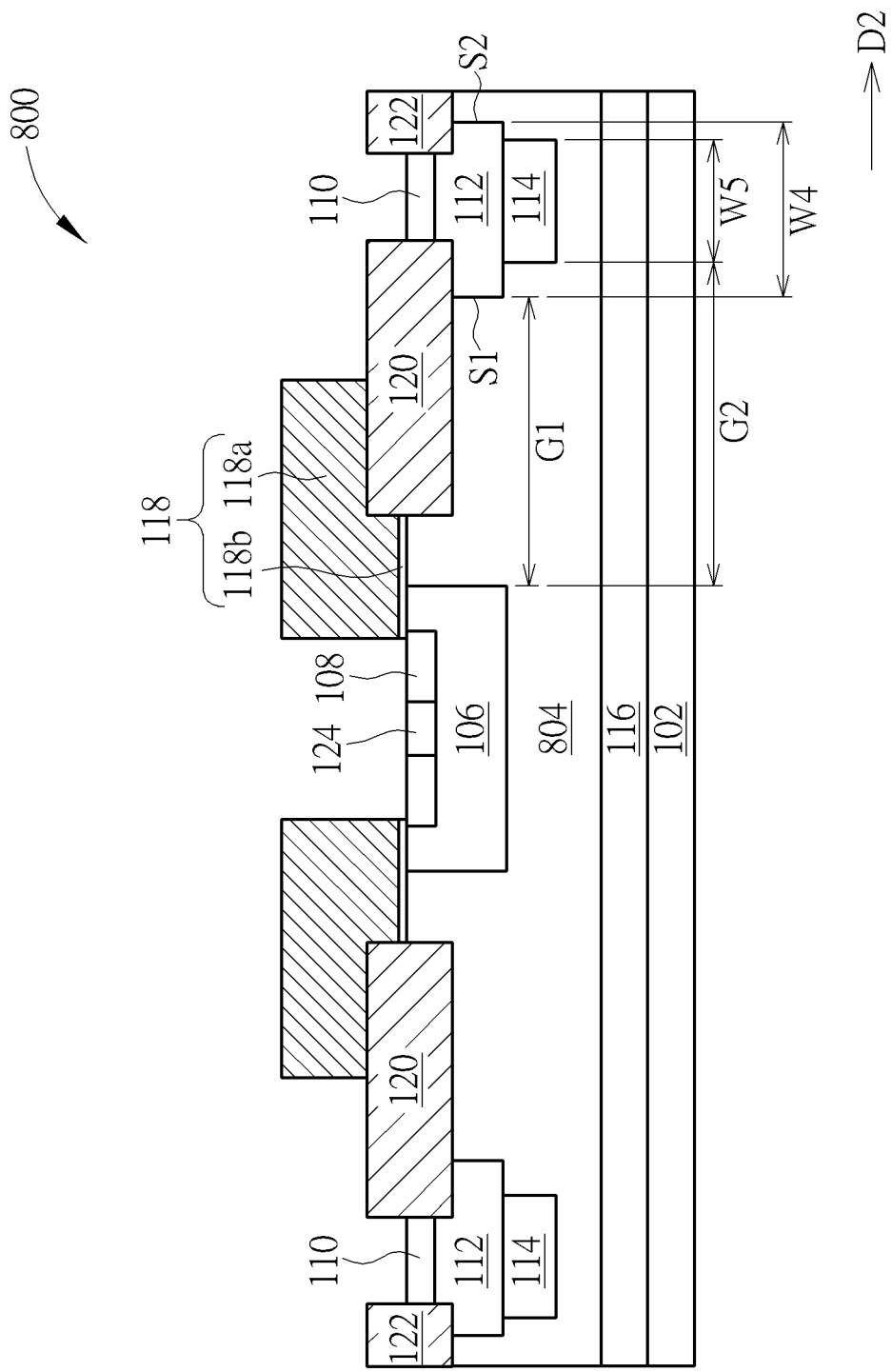
FIG. 12 is a schematic diagram illustrating a cross section of a high voltage transistor according to an eighth embodiment of the present invention.

Please refer to FIG. 12, which is a schematic diagram illustrating a cross section of a high voltage transistor according to an eighth embodiment of the present invention. As shown in FIG. 12, the high voltage well 804 of a high voltage transistor 800 provided by the present embodiment has the first conductivity type comparing to the first embodiment, and the high voltage well 804 and the first base region 106 have the same conductivity type.

In another embodiment, the high voltage transistor may not include the high voltage well and the buried layer also. In another variant embodiment, the through hole of the third embodiment may also be applied to each of the second base regions, or each of the second base regions disposed between a portion of the second doped region adjoining to the first base region and a portion of each of the third doped regions of the fourth embodiment may be adopted, for contacting the third doped regions with the second doped region.

Figure 13:
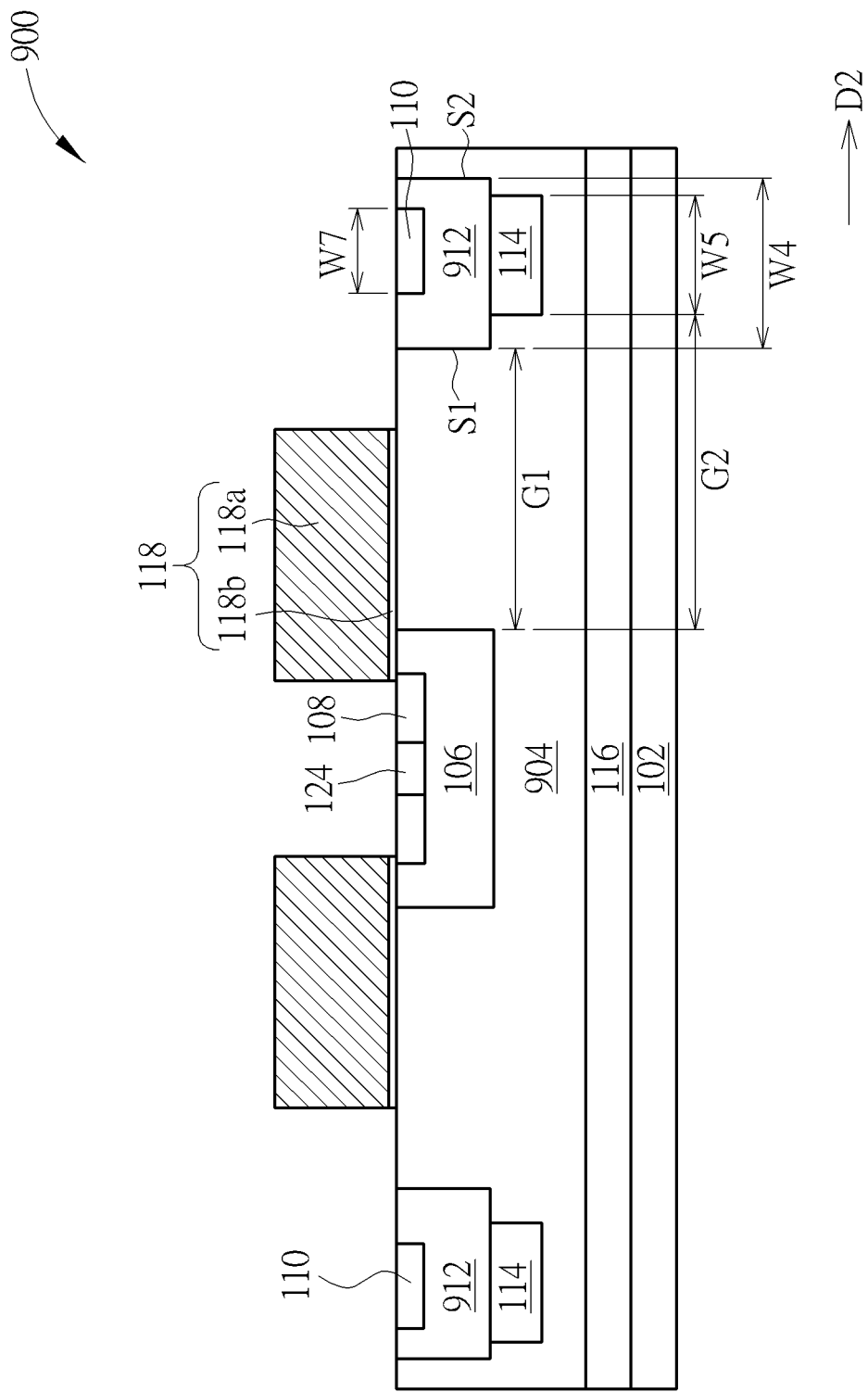
FIG. 13 is a schematic diagram illustrating a cross section of a high voltage transistor according to a ninth embodiment of the present invention.

Please refer to FIG. 13, which is a schematic diagram illustrating a cross section of a high voltage transistor according to a ninth embodiment of the present invention. As shown in FIG. 13, a high voltage transistor 900 provided by the present embodiment does not include the first isolation structure and the second isolation structure comparing to the first embodiment, and the high voltage well 904 has the first conductivity type. In addition, the width W4 of each of the second base regions 912 in the second direction D2 is greater than the width W7 of the second doped region 110 in the second direction D2, and therefore each of the second base regions 912 may be extended to two sides of the corresponding second doped region 110. Specifically, the high voltage transistor 900 of the present embodiment may be a double-diffused-drain MOS (DDDMOS) transistor.

In another embodiment, the high voltage transistor may not include the high voltage well and the buried layer also. In another variant embodiment, the through hole of the third embodiment may also be applied to each of the second base regions, or each of the second base regions disposed between a portion of the second doped region adjoining to the first base region and a portion of each of the third doped regions of the fourth embodiment may be adopted, for contacting the third doped regions with the second doped region.

In summary, the second base region is disposed between the second doped region and the third doped region in the high voltage transistor provided by the present invention, and the first side edge of the second base region facing the first base region is contacted with the high voltage well. Therefore, not only the holding voltage and the ability to endure the ESD voltage can be effectively enhanced, the trigger voltage can also be effectively reduced, and the area of the device can then be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage transistor, comprising:
   a substrate;
   a high voltage well, disposed in the substrate;
   a first base region, disposed in the high voltage well, wherein the first base region has a first conductivity type;
   a first doped region, disposed in the first base region, wherein the first doped region has a second conductivity type complementary to the first conductivity type;
   a second doped region, disposed in the high voltage well at one side of the first base region, wherein the second doped region has the second conductivity type, and the second doped region has a first doping concentration;
   a second base region, disposed in the high voltage well under the second doped region, and the second base region being contacted with the second doped region, wherein the second base region is contacted with the high voltage well, the second base region has the second conductivity type, the second base region has a second doping concentration, and the second doping concentration is less than the first doping concentration; and
   a third doped region, disposed in the high voltage well under the second base region, and the third doped region being contacted with the second base region, wherein the third doped region has the second conductivity type, the third doped region has a third doping concentration, and the third doping concentration is less than the second doping concentration.

2. The high voltage transistor according to claim 1, wherein the third doped region is not contacted with the second doped region.

3. The high voltage transistor according to claim 2, wherein a distance between a first side edge and a second side edge opposite to the first side edge of the second base region is greater than a distance between two outer side edges of the third doped region.

4. The high voltage transistor according to claim 1, wherein the third doped region is contacted with the second doped region.

5. The high voltage transistor according to claim 4, wherein the second base region has a through hole, and the third doped region is contacted with the second doped region via the through hole.

6. The high voltage transistor according to claim 4, wherein the third doped region is extended to a side of the second base region opposite to the first side edge and contacted with the second doped region.

7. The high voltage transistor according to claim 1, wherein the first doping concentration is substantially $10^{19}$ $cm^{-3}$ to $10^{20}$ $cm^{-3}$, the second doping concentration is substantially $4 \times 10^{17}$ $cm^{-3}$ to $1 \times 10^{18}$ $cm^{-3}$, and the third doping concentration is substantially $5 \times 10$ $cm^{-3}$ to $8 \times 10^{16}$ $cm^{-3}$.

8. The high voltage transistor according to claim 1, wherein the high voltage well has the second conductivity type, the high voltage well has a fourth doping concentration, and the fourth doping concentration is less than the third doping concentration.

9. The high voltage transistor according to claim 8, wherein the fourth doping concentration is substantially $4 \times 10^{15}$ $cm^{-3}$ to $1 \times 10^{16}$ $cm^{-3}$.

10. The high voltage transistor according to claim 1, further comprising a high voltage deep well disposed in the high voltage well, and the high voltage deep well encompassing the first base region, wherein the high voltage deep well has the first conductivity type.

11. The high voltage transistor according to claim 1, wherein the high voltage well has the first conductivity type.

12. The high voltage transistor according to claim 1, further comprising a buried layer disposed in the substrate, wherein the buried layer has the second conductivity type, and the high voltage well is disposed on the buried layer.

13. The high voltage transistor according to claim 1, wherein the first conductivity type is n-type, and the second conductivity type is p-type.

14. The high voltage transistor according to claim 1, further comprising a gate structure disposed on the first base region and the high voltage well between the second base region and the first doped region.

15. The high voltage transistor according to claim 14, further comprising an isolation structure disposed between the gate structure and the high voltage well, and the gate structure being separated from the second doped region by the isolation structure.

16. The high voltage transistor according to claim 1, further comprising a doped contact region disposed in the first doped region, and the doped contact region having the second conductivity type.

17. The high voltage transistor according to claim 1, wherein the second doped region surrounds the first base region.

18. The high voltage transistor according to claim 1, wherein the first base region has a racetrack-shaped layout, the first base region includes a long axis and a short axis, and a width of the second base region in a direction parallel to the long axis is greater than or equal to a width of a straight side edge of the first base region in the direction.

19. A high voltage transistor, comprising:
   a substrate;
   a first base region, disposed in the substrate, wherein the first base region has a first conductivity type;
   a first doped region, disposed in the first base region, wherein the first doped region has a second conductivity type complementary to the first conductivity type;
   a second doped region, disposed in the substrate at one side of the first base region, wherein the second doped region has the second conductivity type, and the second doped region has a first doping concentration;

a second base region, disposed in the substrate under the second doped region, and the second base region being contacted with the second doped region, wherein the second base region has the second conductivity type, the second base region has a second doping concentration, and the second doping concentration is less than the first doping concentration; and a third doped region, disposed in the substrate under the second base region, the third doped region being contacted with the second base region, and a distance between a first side edge of the second base region facing the first base region and a straight side edge of the first base region facing the second base region being less than a distance between an outer side edge of the third doped region facing the first base region and the straight side edge of the first base region, wherein the third doped region has the second conductivity type, the third doped region has a third doping concentration, and the third doping concentration is less than the second doping concentration.

* * * * *